United States Patent [19]
Kimber

[11] Patent Number: 5,378,899
[45] Date of Patent: Jan. 3, 1995

[54] ION IMPLANTATION TARGET CHARGE CONTROL SYSTEM

[76] Inventor: Eugene L. Kimber, 950 W. Brookcrest Cir., South Jordan, Utah 84065

[21] Appl. No.: 133,746

[22] Filed: Oct. 7, 1993

[51] Int. Cl.⁶ .............................................. H01J 37/317
[52] U.S. Cl. ................................ 250/492.21; 250/398
[58] Field of Search ................... 250/492.21, 492.2, 398

[56] References Cited

U.S. PATENT DOCUMENTS

| | | | |
|---|---|---|---|
| 4,361,762 | 11/1982 | Douglas | 250/492.21 |
| 4,929,840 | 5/1990 | Dykstra et al. | 250/492.21 |
| 5,126,576 | 6/1992 | Wauk et al. | 250/492.21 |

*Primary Examiner*—Jack I. Berman
*Attorney, Agent, or Firm*—Bill D. McCarthy; Louis W. Watson

[57] ABSTRACT

A control system is provided for an ion implanter having an electron shower filament and a Faraday flag provided wherein the electron shower output is adjusted to maintain substantially continuous control of disk current during implantation, the control of the disk current of a target wafer during implantation being achieved by electrically isolating the target wafer, monitoring the disk current, and maintaining the electron shower filament current of the ion implanter at a level which permits rapid adjustment of the disk current during the time period required to close the Faraday flag.

5 Claims, 3 Drawing Sheets

ION IMPLANTATION TARGET CHARGE CONTROL SYSTEM

BACKGROUND OF THE INVENTION

1. Field of the Invention

The present invention relates to a system for implanting ions on a target material, and more particularly but not by way of limitation, to a control system for adjusting an electron shower output to maintain substantially continuous control of disk current during ion implantation.

2. Description of the Prior Art

In the fabrication of semiconductors, an implanter is used to deposit ions into a material which determines the conduction properties of the silicon disk wafer. A typical implanter consists of an ion source, an analyzer, a Faraday flag, an electron shower, and a disk assembly. The ion source supplies the ions to be implanted. These ions can be of several different chemical elements and pass through a magnetic field in the analyzer. Based on the mass to charge ratio of the generated ions, the analyzer selects certain ions to reach the target wafer for implantation. The Faraday flag is a monitoring assembly for measurement and setup prior to implanting. Typically made of graphite, the Faraday flag is used to block the ion stream before implantation begins and is physically moved to allow the ions to reach the target wafer during implantation. In the closed position, the Faraday flag blocks the ion beam whose action causes emission of secondary electrons. To prevent loss of these secondary electrons which would result an incorrect measurement of beam current, magnets are attached to the Faraday flag to prevent the escape of secondary electrons. The electron shower neutralizes target water charging and the disk assembly holds the target wafers and scans them through the beam of ions.

If the surface of the target wafer is not conductive, the high energy beam of ions produced by the ion source causes a positive charge to accumulate on the surface of the target wafer. This charge may build up to sufficient levels to cause dielectric breakdown and thus damage devices on the target wafer. The electron shower minimizes the positive charging effect of the ion beam on the target wafer. Negatively charged electrons are generated by heating a filament in the electron shower which causes electrons to boil off and create secondary electrons in the vacuum. These electrons are attracted to the positively charged target wafer and neutralize the charge produced by the beam of ions.

Various control systems have been proposed to monitor the electrons generated and to control the filament current in order to maintain a preset voltage level or charge level on the target wafer. In one prior art control system the implanter is modified to electrically isolate the target wafer so that current passing through the target wafer to ground (the disk current) can be monitored. A positive disk current indicates that too few electrons are being generated and a negative disk current indicates that too many electrons are being generated. The output of the electron shower in such a control system is adjusted only once for the entire operation and, as a result of the uncontrolled charge accumulation, use of such control system does not completely eliminate the destruction caused by charge building up on the target wafer.

The above described prior art control system also suffers from another inherent defect which occurs when the electron shower is turned off once the desired implantation has occurred. That is, in operation the electron shower is turned off the instant implantation is to cease and, at that instant in time, the Faraday flag is closed to block the beam of ions. However, owing to the physical mass involved, the Faraday flag does not close instantly and the delay in closing permits positive charging and associated destruction of the target wafer.

The Faraday flag also causes another undesirable result. Because the Faraday flag has magnets on it, the motion of the flag causes the electrons from the electron shower to surge toward the target wafer. This surge produces an excessive negative disk current regardless of whether the Faraday flag is opening or closing. This surge produces negative charging and associated destruction of the target wafer.

Another prior art control system for controlling the charging of target wafer during and after implantation in an effort to prevent damage to the target wafer is a modification of the above-described control system. In the modified control system the disk current is adjusted at the start of each scan of the ion beam so that the electron shower is held constant for the entire scan. However, this requires complex and expensive apparatus and does not control the charging of the target wafer during the scan.

While these prior art control systems have met with some success, problems associated with undesired charging of the target water and the associated destruction of the target wafer at the end of implantation remain. Therefore, a need exists for a control system wherein the destructive effects of target wafer charging are substantially eliminated. It is to such a control system that the present invention is directed.

SUMMARY OF THE INVENTION

According to the present invention, a control system for an ion implanter having an electron shower filament and a Faraday flag is provided wherein the output of the electron shower filament is adjusted so as to maintain substantially continuous control of disk current during implantation of a target wafer. Broadly, the continuous control of the disk current of the target wafer during implantation is achieved by electrically isolating the target wafer, monitoring the disk current, and controlling the electron shower filament current of the ion implanter at a level which maintains the disk current at a preset level. This control is extended to include the time to close the Faraday flag and its attendant surge of electrons.

More specifically, the disk current through the target wafer is monitored to convert the disk current to a proportional voltage which is compared to an operator-selected set point. Thus, the disk current of the target wafer during implantation is controlled by continuously monitoring and adjusting the shower filament current to maintain the disk current at the operator-selected setpoint. The electron shower filament current is maintained at a level at which the filament can emit electrons, while being low enough to not substantially affect disk current or draw more than the minimum power required for consistent rapid operation. The onset of control is maintained during opening of the Faraday flag and the maintenance of control for the time required to close the Faraday flag.

DETAILED DESCRIPTION

Figure 1:
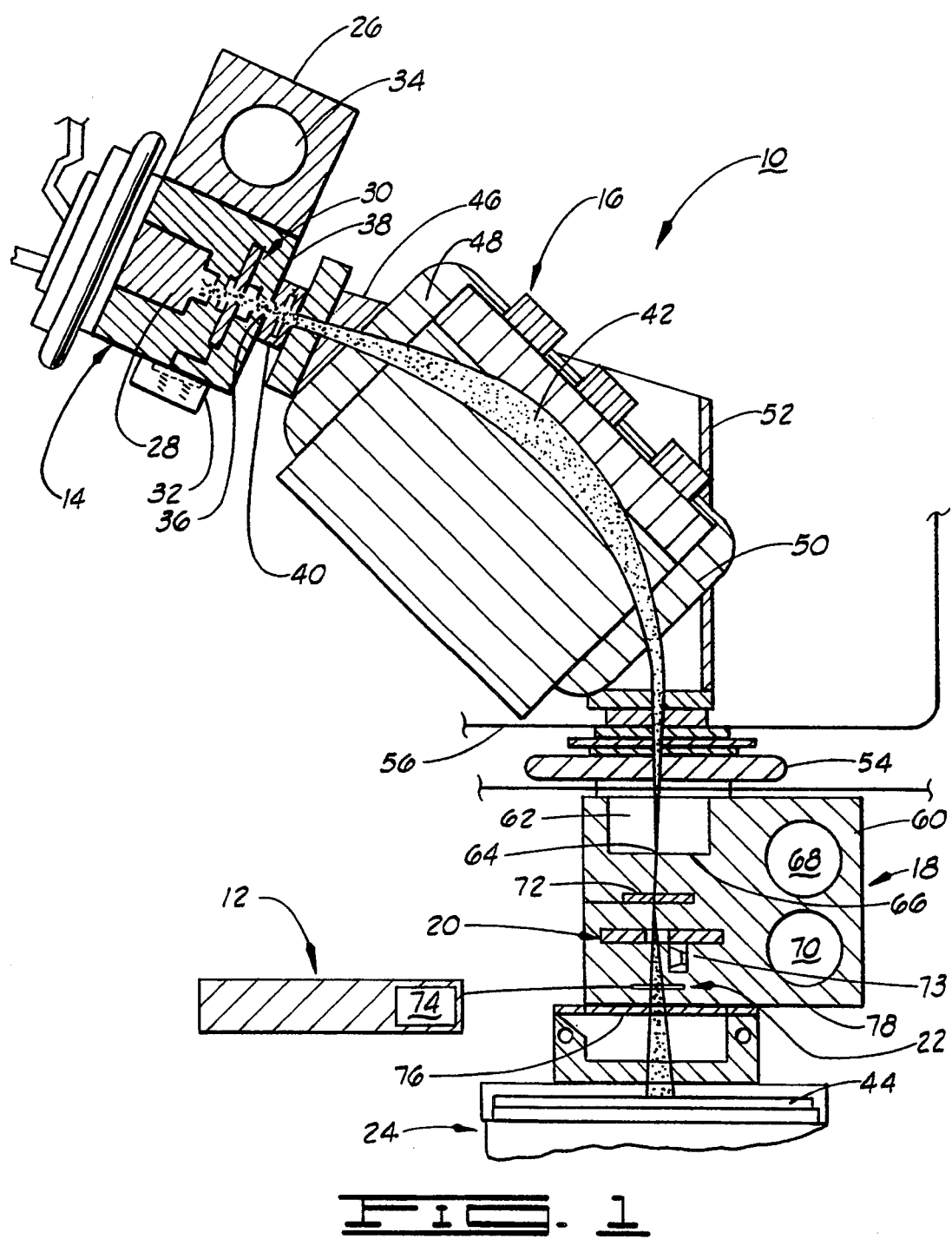
FIG. 1 is a plan view, partially in cross section, of an ion implanter employing the control system of the present invention for maintaining substantially continuous control of disk current during ion implantation.

Referring to the drawings, and more particularly to FIG. 1, an ion implanter 10 having an electron shower control system 12 of the present invention is illustrated. With the exceptions noted hereinafter relating to the electron shower control system 12 and its connection to the ion implanter 10, the ion implanter 10 is a conventional unit having a source assembly 14, a beam guide assembly 16, a post-acceleration assembly 18, a flag assembly 20, an electron shower assembly 22 and a disk or target wafer processing assembly 24. As will be more clearly set forth hereinafter, the electron shower control system 12 is connected to the electron shower assembly 22 so that the output of the source assembly 14 can be adjusted to provide substantially continuous control of the disk current during ion implantation.

The source assembly 14 includes a source housing 26, an ion source 28, an extraction electrode assembly 30, an electrode manipulator 32 and a diffusion pump 34. A source defining aperture 36 is mounted in housing wall 38 of the source housing 26 substantially as shown. A vacuum valve 40 is disposed between the source defining aperture 36 and the beam guide assembly 16.

The beam guide assembly 16, which directs an ion beam 42 along an arcuate path to a target wafer 44 supported in the disk processing assembly 24, includes a beam guide 46, two analyzer magnetic coils 48, 50 positioned above and below the beam guide 46, respectively and a striker plate 52. The ions in the ion beam 42 are selectively deflected on the basis of their charge to mass ratio by the analyzer magnetic coils 48, 50. A post-acceleration insulating bushing 54 is disposed between the beam guide assembly and the post-acceleration assembly 18.

The post-acceleration assembly 18 includes a post-acceleration housing 60, a post-acceleration tube 62 having a resolving aperture 64 mounted on one end 66 thereof, two cryogenic pumps 68, 70 and a post-acceleration electrode assembly 72. The flag assembly 20, which includes a Faraday flag 73, is mounted in the post-acceleration housing 60 so as to be disposed between the post-acceleration electrode assembly 72 and the electron shower assembly 22.

The Faraday flag 73 is selectively moveable between a first or closed position and a second or open position. In the closed position, the Faraday flag 73 blocks the ion beam 42 from contact with the target wafer 44; and in the open position, the Faraday flag 73 permits the ion beam 42 to reach and make contact with the target wafer 44. However, it should be noted that when the Faraday flag 73 is moved from the open to the closed position, blockage of the ion beam 42 is not instantaneous. That is, first none, then part, then all the ions are intercepted as the Faraday flag 73 is moved to the closed position.

The electron shower assembly 22 is supported in the post-acceleration housing 60 so that the ion beam 42 is directed through the electron shower assembly 22 when the Faraday flag 73 is in the open position. The electron shower assembly 22 is connected to an electron shower power assembly 74. As will be described in more detail with reference to FIGS. 2 and 3, the control system 12, which includes the electron shower power assembly 74, is connected to the electron shower assembly 22 so that the output of the source assembly 14 can be adjusted and thereby provide substantially continuous control of the disk current during ion implantation.

A vacuum valve 76 is disposed adjacent a wall 78 of the post-acceleration housing 60 so that the ion beam 42 passing through the electron shower assembly 22 can strike the target wafers to be implanted, such as the target wafer 44 supported in the disk process assembly 24.

As previously stated, with the exception of the control system 12 and its connection to the ion implanter 10, the ion implanter 10 is a conventional commercially available unit such as a High Current Implantation System Model No. Nova NV-10-160 manufactured by Eaton Semiconductor Equipment, Ion Beam Systems Division. However, when employing the control system 12 of the present invention with the ion implanter 10 via its connection to the electron shower assembly 22, the output of the electron shower assembly 22 can be adjusted to provide substantially continuous control of the disk current during ion implantation to the target wafer 44.

Figure 2:
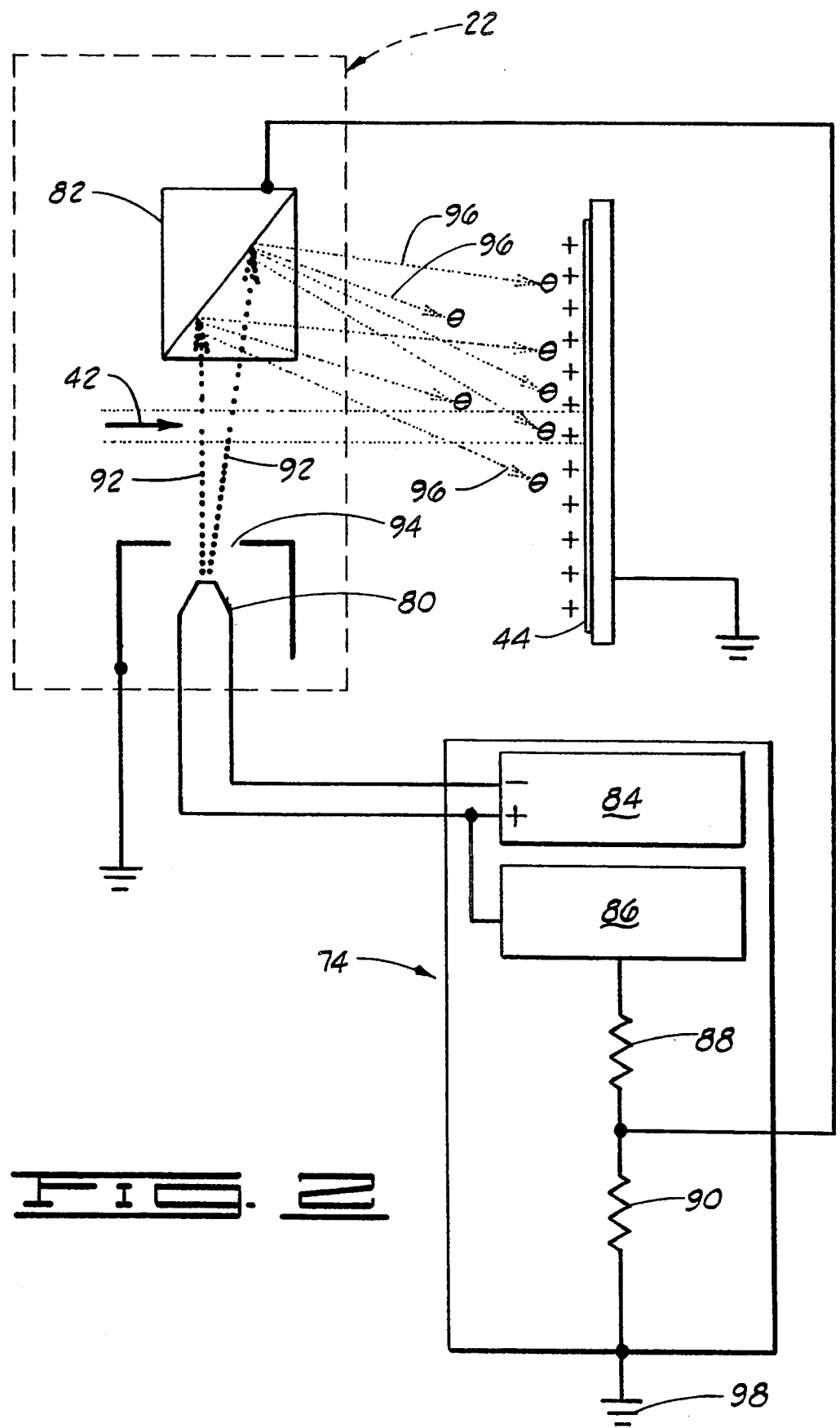
FIG. 2 is a schematic representation of an electron shower of the ion implanter of FIG. 1 illustrating a portion of the control system.

Referring now to FIG. 2, the electron shower assembly 22 and the electron shower power assembly 74 are schematically illustrated. The electron shower assembly 22 consists of a filament 80 and an electron shower target 82; and the electron shower power assembly 74 consists of a low voltage power supply 84, a −300 volt power supply 86, an electron shower primary emission current measuring resistor 88 (hereinafter referred to as the primary resistor 88) and an electron shower secondary emission current measuring resistor 90 (hereinafter referred to as the secondary resistor 90).

The filament 80 is connected to the low voltage power supply 84 and to the power supply 86 so that upon activation the filament 80 is heated by the low voltage power supply 84 which results in the emission of primary electrons 92 from the filament 80. The primary electrons 92 pass through a grounded aperture 94 in the direction of the electron shower target 82 of the electron shower assembly 22. When the primary electrons 92 strike the electron shower target 82, a majority of the primary electrons 92 are absorbed by the electron shower target 82 and a minor portion of the primary electrons 92 are emitted from the target 82 as secondary electrons 96. The secondary electrons 96 then strike the target wafer 44 and neutralize the charge caused by the ion beam 42.

Monitoring of the neutralization of the charge produced on the target wafer 44 by the ion beam 42 is achieved by incorporation of the primary and secondary resistors 88, 90 into the electron shower power assembly 74. The primary resistor 88 is a 1 ohm resistor; and the secondary resistor 90 is also a 1 ohm resistor. The primary resistor 88 is connected between the −300 volt power supply 86 of the electron shower power assembly 74 and the electron shower target 82 of the electron shower assembly 22 so that the current of the primary electrons 92 emitted by the filament 80 flow through the primary resistor 88; and the secondary resistor 90 is connected between the electron shower target 82 and ground 98 so that the current associated with the emission of the secondary electrons 96 by the electron shower target 82 flows through the secondary resistor 90.

Figure 3:
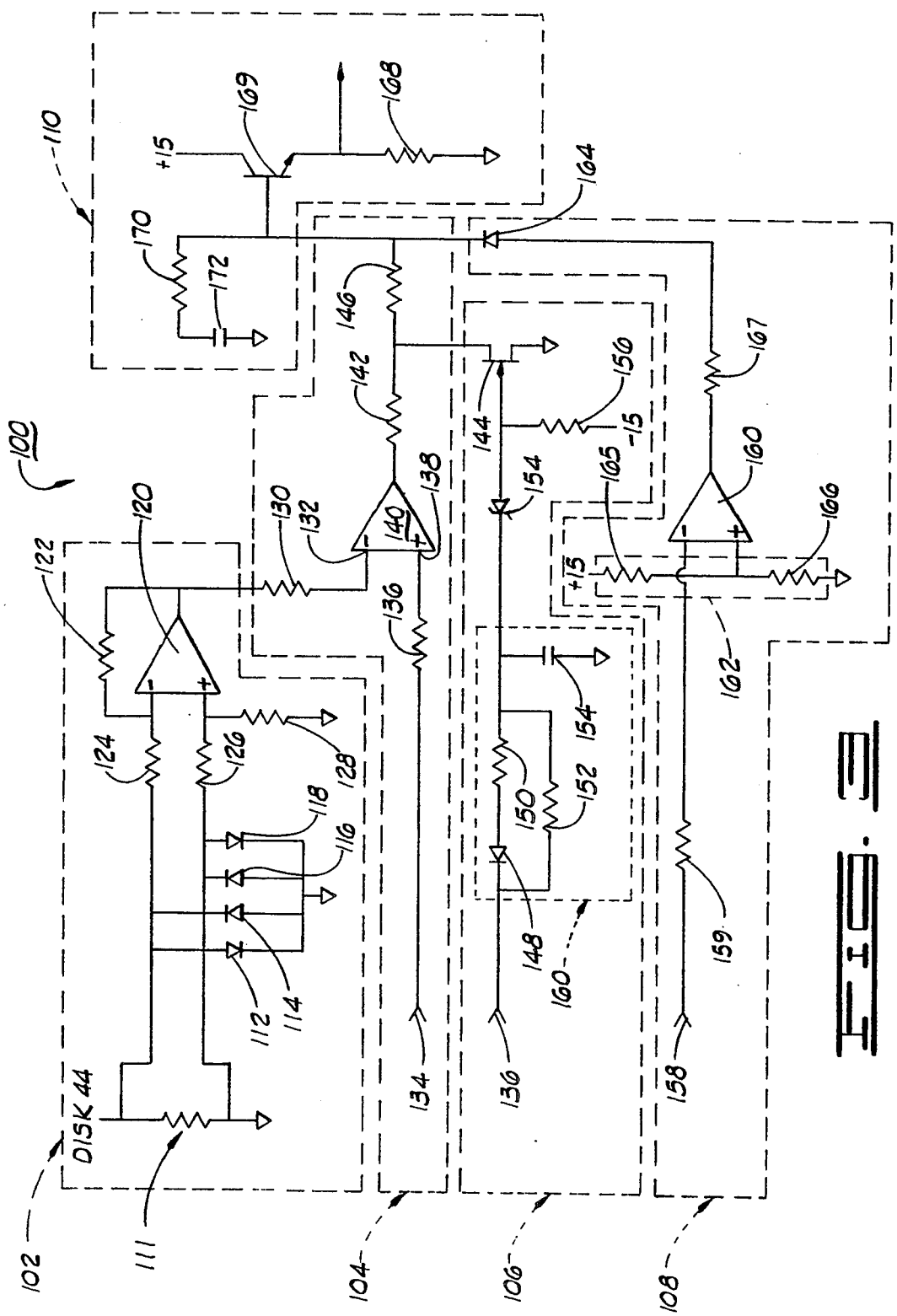
FIG. 3 is the circuit diagram of the control system of FIG. 2.

Referring now to FIG. 3, a control circuit 100 is illustrated for adjusting the electron shower output so as to maintain substantially continuous control of disk current of the target wafer 44 during ion implantation in accordance with the present invention. The control circuit 100 consists of the following functional circuit blocks, namely: a first circuit 102 to measure the current from the target water 44 to ground and produce a voltage proportional to such current; a second circuit 104 to produce a voltage proportional to the difference between a set point value selected by operator control and the disk current; a third circuit 106 which rapidly turns on the electron shower assembly 22 at the start of implantation but slowly turns off the electron shower assembly 22 at the end of implantation to allow the Faraday flag 73 of the flag assembly 20 to close; a fourth circuit 108 which maintains a minimum current in the electron shower assembly 22 at a level at which the filament 80 emits comparatively few electrons but is in a standby mode so that the filament 80 is warmed up and ready to emit electrons when additional current is supplied to the filament 80; and a fifth or output buffer circuit 110 to dampen rapid fluctuations in output to the filament 80 of the electron shower assembly 22 and to provide sufficient power to drive the low voltage power supply 84 of the electron shower power assembly 74. The operation of each of these circuits will now be described.

As previously stated, the first circuit 102 converts the disk current to a voltage The input for the first circuit 102 is from a secondary resistor 111, preferably a one ohm resistor which is connected to the electrically isolated target water 44 via a connection (not shown). Diodes 112, 114, 116 and 118 clamp the input to prevent transients caused by various electrical events from damaging the circuitry. Any suitable commercially available diode can be used as the diodes 112–118, such as a 1N4001 diode manufactured by National Semiconductor Corporation of Santa Clara, Calif. The input is then fed to an operational or instrumentation amplifier 120. The gain of the operational amplifier 120 is preferably set to $-100$ by a plurality of resistors, such as resistors 122, 124, 126 and 128. Output from the operational amplifier 120, a voltage equal to the water disk current times $-100$, is fed via a 10 kilohm resistor 130 to a negative input 132 of the second circuit 104 which subtracts the analog of the disk current from the voltage selected by a thumbwheel switch (not shown) which sets the voltage 134.

The output voltage of the thumbwheel switch is passed via a 10 kilohm resistor 136 to a positive input 138 of an operational amplifier 140 where the inputs are subtracted by the operational amplifier 140. The voltage 134 has been found to substantially lessen destruction of devices on the target water 44 and consequential destruction of the target wafer 44 and devices on the target wafer 44 when set such that the disk current is maintained between about $-2$ mA and about $-4$ mA, and more desirably about $-2.5$ mA. A disk current of about $-2.5$ mA corresponds to a voltage 134 of about 250 mV because of the gain of $-100$ at the operational amplifier 120. The voltage is then fed to a loading resistor 142 so that the output can be shorted to ground by a field effect transistor 144 of functional block 106. The output of the operational amplifier 140, the loading resistor 142 and the field effect transistor 144 is then further loaded by a 10 kilohm resistor 146 to allow the operation of the functional block 108.

The third circuit 106 provides continuous control of the disk current only during implantation of the target water 44. The input signal for the third circuit 106, which is designated by the numeral 136, is 12 V until the moment at which the ion implanter 10 begins to open the Faraday flag 73 of the flag assembly At that time the input signal 136 for the third circuit 106 drops to 0 V. A diode 148, two resistors 150, 152 and a capacitor 154 provide a subcircuit 160 in the third circuit 106 whose output goes low quickly to enable continuous rapid control of the disk current, but goes high slowly in order to continue control of the disk current while the Faraday flag 73 is moving to the closed position. That is, when the input signal for the third circuit 106 is high, the diode 148 is reversed biased and nonconducting, effectively removing the resistor 150, a 1 kilohm resistor, from the subcircuit 160. This results in the subcircuit 160 having a large time constant on the order of 10.3 seconds. On the other hand, when the input signal for the third circuit represented by the functional block 106 goes low, the diode 148 conducts effectively shorting the resistor 152, a 220 kilohm resistor, through the resistor 150, giving a time constant on the order of a few tenths of a second. The exact value of the time constant depends on the conductance curve of the diode 148. The precise value is not important so long as it effectively turns off the field effect transistor 144 before the Faraday flag 73 opens enough to allow charging of the target wafer 44. Correspondingly, the time constant adjusted by resistor 152 needs to be long enough to allow time for the Faraday flag 73 to move to the closed position. For example, the component value of 220 kilohms for the resistor 152 maintains the field effect transistor 144 in the off mode for about two or three seconds, a time period sufficient to allow the Faraday flag 73 to move to the closed position.

The third circuit 106 also includes a Zener diode 154 and resistor 156, the combination of which are used to bias the field effect transistor 144. Thus, the net effect of the third circuit 106 is that initially, before implantation begins, the input signal for the third circuit 106 is 12 volts, making the gate of the field effect transistor 144 positive with respect to the drain, turning it on and shorting the output of first circuit 102 to ground, preventing an increase in the disk current. However, when the Faraday flag 73 begins to move to the closed position, the input signal for the third circuit goes low, rapidly forcing the field effect transistor 144 off, and thus allowing control of the disk current.

The fourth circuit 108 maintains the minimum, substantially nonemitting current in the filament 80 of the electron shower assembly 22. Input 158 for the fourth circuit is a voltage proportional to the electrons actually emitted by the filament 80 of the electron shower assembly 22. This is the voltage produced by that current passing through the one ohm primary resistor 88 and amplified by a factor of 10. Therefore, the maximum electron shower output of about 400 mA produces a voltage of 4 V as the input signal of the fourth circuit. The input 158 of the fourth circuit 108 passes through a resistor 159 to an operational amplifier 160 having a voltage divider 162 (which presents a potential of about 27 mV at the positive input to the operational amplifier 160) and a diode 164. The voltage divider consists of resistors 165, 166. The output of the operational amplifier 160 is loaded by resistor 167.

The positive input to the operational amplifier 160, combined with the fifth or output buffer circuit of functional block 110, forms a control loop which maintains the minimum emission of the filament 80 of the electron shower assembly 22 at about 2.7 mA, approximately 0.67% of its maximum output. The diode 164 causes the third circuit (functional block 106) to have no effect unless the first, second, third and fifth circuits of the functional blocks 102, 104, 106 and 110, respectively, would cause the electron shower output to drop below about 27 mA, in which case the diode 164 holds the output of the filament 80 of the electron shower assembly 22 at this minimum level.

The fifth or output buffer circuit 110 includes a transistor 169, an emitter current-limiting resistor 168, a resistor 170 and a capacitor 172. The output buffer circuit supplies sufficient power to drive the control to the filament 80 of the electron shower assembly 22. In operation, the time constant in an RC circuit (which includes the resistor 170 and the capacitor 172) arc adjusted until large enough to prevent ringing due to the relatively large time it takes to physically change the temperature of the filament 80 of the electron shower assembly 22.

The control system 100 described above permits the output of the electron shower filament 80 to be adjusted so that substantially continuous control of disk current is maintained during ion implantation. Thus, the control system 100 of the present invention substantially eliminates the destructive effects of wafer charging during ion implantation.

From the above description it is clear that the present invention is well adapted to carry out the objects and to attain the ends and advantages mentioned herein as well as those inherent in the invention. While presently preferred embodiments of the invention have been described for purposes of this disclosure, it will be understood that numerous changes may be made which will readily suggest themselves to those skilled in the art and which are accomplished within the spirit of the invention disclosed and as defined in the appended claims.

What is claimed is:

1. A control system for minimizing destructive dielectric breakdown of devices on a target wafer during ion implantation by substantially continuously controlling disk current wherein the ion implantation is achieved by the use of an ion implanter having an electron shower filament for generating electrons to offset the charging effect of the ion beam and a Faraday flag selectively movable between an open position wherein an ion beam and electrons emitted from the electron shower filament contact the target wafer and a closed position wherein the ion beam is blocked from contact with the target water, the control system comprising:
   means for electrically isolating the target wafer;
   means for monitoring the disk current; and
   means for maintaining the electron shower filament at a level which permits rapid adjustment of disk current while providing control of disk current during the time period required to close the Faraday flag.

2. A control circuit for minimizing destructive dielectric breakdown of devices on a target wafer during ion implantation with a ion implanter having a electron shower filament capable of emitting electrons and a Faraday flag by substantially continuously controlling disc current, the control circuit, the Faraday flag selectively movable between an open position wherein an ion beam and electrons emitted from the electron shower filament contact the target wafer and a closed position wherein the ion beam is blocked from contact with the target wafer, the control circuit comprising:
   means for monitoring electrical current through the target wafer and for converting the monitored electrical current into a proportional voltage;
   means for comparing the proportional voltage to an operator-selected set point, the means for monitoring electrical current and the means for comparing the proportional voltage to an operator-selected set point cooperating to substantially continuously control the disk current of the target wafer during implantation by continuously monitoring the disk current and adjusting the disk current as required to maintain the set point;
   means for maintaining the electron shower filament current at a level capable of emitting electrons but at a level insufficient to affect the disk current or the minimum power required for rapid operation;
   means for compensating for the surge of electrons caused by any movement of the Faraday flag;
   means for providing onset control during movement of the Faraday flag to the open position and for maintenance of control during closing of the Faraday flag; and
   damping means for preventing oscillation while maintaining sufficient output to control the filament current.

3. A method for minimizing destructive dielectric breakdown of devices on a target wafer during ion implantation with a ion implanter by continuously controlling disk current, the ion implanter having a electron shower filament capable of emitting electrons and a Faraday flag, the Faraday flag selectively movable between an open position wherein an ion beam and electrons from the electron shower filament contact the target water and a closed position wherein the ion beam is blocked from contact with the target wafer, the method comprising:
   monitoring the electrical current through the target wafer;
   converting the monitored electrical current to a proportional voltage;
   comparing the proportional voltage to an operator-selected set point and continuously adjusting the disk current during implantation of the target water so as to maintain the set point;
   maintaining the electron shower filament current at a level capable of emitting electrons but at a level sufficient to affect a primary current of the minimum power required for rapid operation;
   providing electron surge control during opening of the Faraday flag;
   maintaining electron surge control during closing of the Faraday flag;
   providing onset control during opening of the Faraday flag;
   maintaining control during closing of the Faraday flag: and
   preventing oscillation while maintaining sufficient output to control the filament current.

4. A method for minimizing destructive dielectric breakdown of devices on a target water during ion implantation with a ion implanter having a electron shower filament capable of emitting electrons and a Faraday flag by substantially continuously controlling disk current comprising:

monitoring the disk current through the target wafer;

substantially continuously adjusting the disk current to an operator-prescribed set point;

controlling the electron surge during motion of the Faraday flag;

controlling the disk current during the time interval required to operate the Faraday flag; and maintaining the electron shower filament current at a level which allows rapid change in the electron shower.

5. A control circuit for an ion implantation apparatus of the type including an ion source and a Faraday flag selectively movable between a closed position and an open position, the electron shower having an internal filament for generating electrons at a rate monotonically increasing in response to an electrical current passed through the filament and ion acceleration means for directing a beam of ions generated in the ion source to a target water to be implanted with the ions when the Faraday flag is in the open position, the disk current sensing means forming the secondary electron source, the ion beam and the target water into an electrical circuit through which a disk current, equal to the net rate of transfer of electrical charge from the ion source and electrical shower to the target wafer via the ion beam and electrons from electron shower, is passed during implantation of ions in the target water, the control circuit comprising:

means for electrically isolating the target water during ion implantation;

disk current sensing means for measuring the disk current and for generating a disk current indication signal indicative of the magnitude of the disk current; and filament current control means electrically connected between the disk current sensing means and the filament for passing a current through the filament in inverse relation to the difference between the set value and the disk current and for maintaining control of the current passing through the filament during opening and closing of the Faraday flag.

* * * * *